(12) United States Patent
Sakamoto et al.

(10) Patent No.: US 9,711,439 B2
(45) Date of Patent: Jul. 18, 2017

(54) PRINTED WIRING BOARD AND METHOD FOR MANUFACTURING THE SAME

(71) Applicant: IBIDEN CO., LTD., Ogaki-shi (JP)

(72) Inventors: Hajime Sakamoto, Ogaki (JP); Nobuya Takahashi, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/841,923

(22) Filed: Sep. 1, 2015

(65) Prior Publication Data

US 2016/0066423 A1      Mar. 3, 2016

(30) Foreign Application Priority Data

Sep. 1, 2014   (JP) ................................ 2014-176735

(51) Int. Cl.
*H05K 1/02* (2006.01)
*H05K 1/18* (2006.01)
(Continued)

(52) U.S. Cl.
CPC .... *H01L 23/49822* (2013.01); *H01L 23/5383* (2013.01); *H01L 23/5384* (2013.01); *H01L 23/5385* (2013.01); *H05K 1/02* (2013.01); *H05K 1/181* (2013.01); *H05K 3/4694* (2013.01); *H01L 23/49827* (2013.01); *H01L 2224/16225* (2013.01); *H05K 1/113* (2013.01); *H05K 1/141* (2013.01); *H05K 3/0017* (2013.01); *H05K 3/108* (2013.01); *H05K 2201/0769* (2013.01); *H05K 2201/09036* (2013.01);
(Continued)

(58) Field of Classification Search
CPC ........... H01L 23/49822; H01L 23/5383; H01L 23/5384; H01L 23/5385; H01L 2224/16225; H01L 23/49827; H05K 1/02; H05K 1/181; H05K 3/4694; H05K 1/141; H05K 2201/10522; H05K 2201/1053; H05K 2201/10674; H05K 2201/09036; H05K 3/108; H05K 1/113
See application file for complete search history.

(56) References Cited

U.S. PATENT DOCUMENTS 9,035,461 B2 * 5/2015 Hu .......................... H01L 24/19
                                                       257/696
2011/0304059 A1* 12/2011 Kobayashi ........... H05K 3/3436
                                                       257/778

FOREIGN PATENT DOCUMENTS

JP             10-242639 A      9/1998

* cited by examiner

*Primary Examiner* — Ishwarbhai B Patel
(74) *Attorney, Agent, or Firm* — Oblon, McClelland, Maier & Neustadt, L.L.P.

(57) ABSTRACT

A printed wiring board includes an insulating layer including insulating material, and a conductor layer formed on a surface of the insulating layer and including conductor pads and conductor patterns such that the conductor pads are positioned to connect one or more electronic components and that the conductor patterns are formed between the conductor pads. The conductor patterns are formed such that each conductor pattern has a pattern width of 3 μm or less and that the conductor patterns have a pattern interval of 3 μm or less between adjacent conductor patterns, and the insulating layer has recess portions formed on the surface between the conductor patterns at least along the conductor patterns such that the recess portions have a depth in a range of 0.1 μm to 2.0 μm relative to a contact interface at which the conductor patterns and the insulating layer are in contact with each other.

17 Claims, 15 Drawing Sheets

(51) Int. Cl.
  *H01L 23/498* (2006.01)
  *H05K 3/46* (2006.01)
  *H01L 23/538* (2006.01)
  *H05K 3/00* (2006.01)
  *H05K 1/11* (2006.01)
  *H05K 1/14* (2006.01)
  *H05K 3/10* (2006.01)

(52) U.S. Cl.
  CPC ................ *H05K 2201/1053* (2013.01); *H05K 2201/10522* (2013.01); *H05K 2201/10674* (2013.01); *Y02P 70/611* (2015.11)

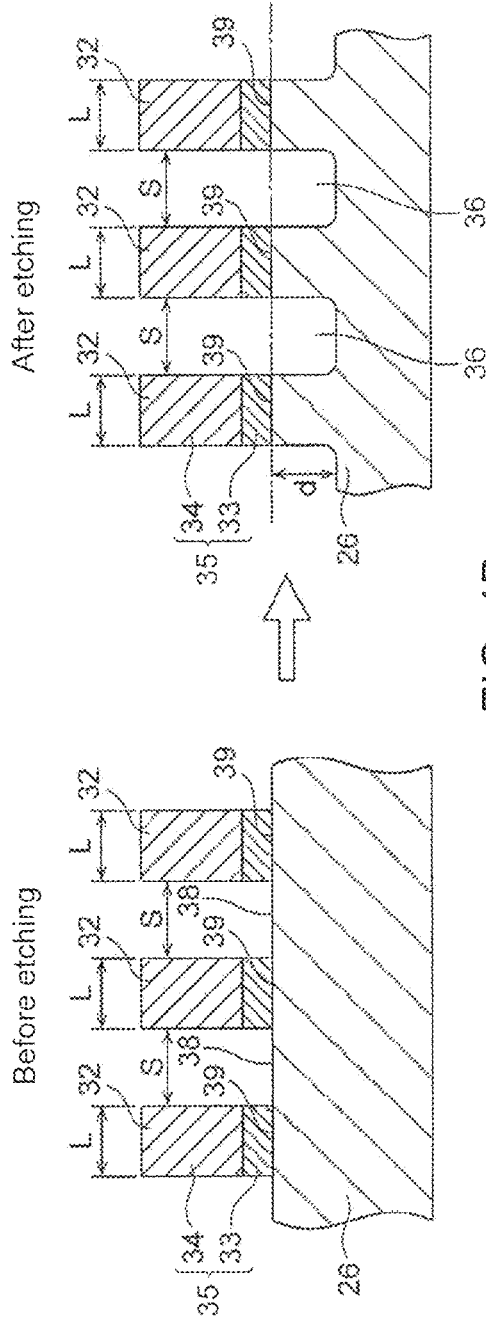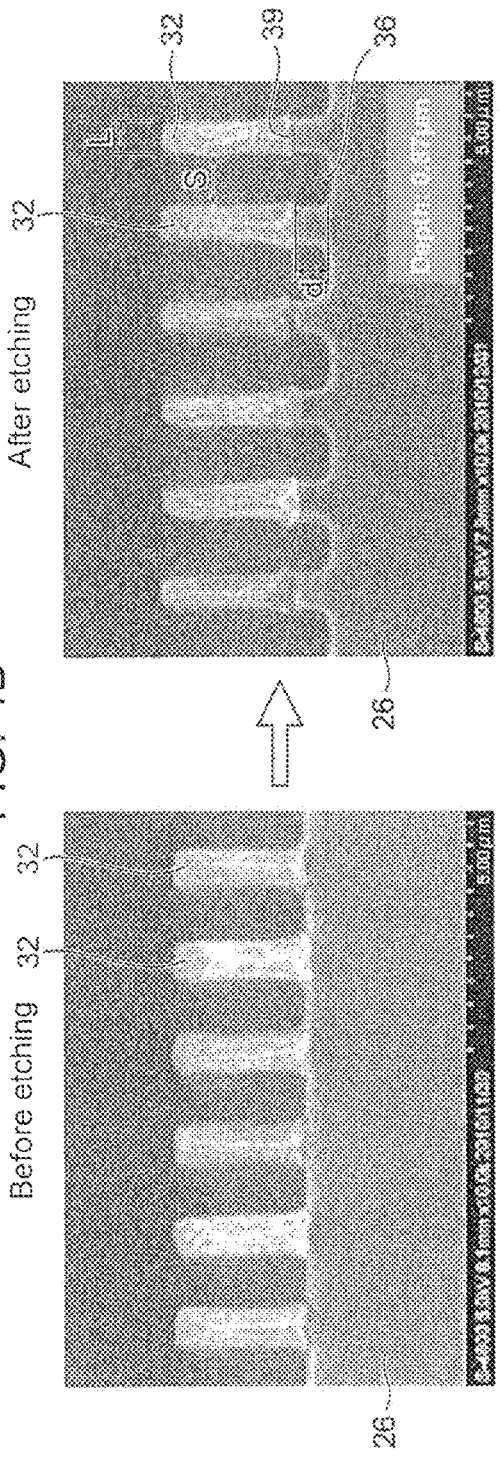

PRINTED WIRING BOARD AND METHOD FOR MANUFACTURING THE SAME

CROSS-REFERENCE TO RELATED APPLICATIONS

The present application is based upon and claims the benefit of priority to Japanese Patent Application No. 2014-176735, filed Sep. 1, 2014, the entire contents of which are incorporated herein by reference.

BACKGROUND OF THE INVENTION

Field of the Invention

The present invention relates to a printed wiring board in which a conductor pad and a conductor pattern are provided on an insulating layer, and a method for manufacturing the printed wiring board.

Description of Background Art

Japanese Patent Laid-Open Publication No. HEI 10-242639 describes a printed wiring board on which an electronic component such as an IC chip (semiconductor element) is mounted. The entire contents of this publication are incorporated herein by reference.

SUMMARY OF THE INVENTION

According to one aspect of the present invention, a printed wiring board includes an insulating layer including an insulating material, and a conductor layer formed on a surface of the insulating layer and including conductor pads and conductor patterns such that the conductor pads are positioned to connect one or more electronic components and that the conductor patterns are formed between the conductor pads. The conductor patterns are formed such that each of the conductor patterns has a pattern width of 3 µm or less and that the conductor patterns have a pattern interval of 3 µm or less between adjacent conductor patterns, and the insulating layer has recess portions formed on the surface between the conductor patterns at least along the conductor patterns such that the recess portions have a depth in a range of 0.1 µm to 2.0 µm relative to a contact interface at which the conductor patterns and the insulating layer are in contact with each other.

According to one aspect of the present invention, a method for manufacturing a printed wiring board includes forming a conductor layer on a surface of an insulating layer such that the conductor layer includes conductor pads positioned to connect one or more electronic component and conductor patterns formed between the conductor pads, and forming recess portions on the surface of the insulating layer between the conductor patterns at least along the conductor patterns such that the recess portions has a depth in a range of 0.1-2.0 µm relative to a contact interface at which the conductor patterns and the insulating layer are in contact with each other. The forming of the conductor layer includes forming the conductor patterns such that each of the conductor patterns has a pattern width of 3 µm or less and that the conductor patterns have a pattern interval of 3 JAM or less between adjacent conductor patterns.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 4A and 4B illustrate diagrams for describing formation of a recess illustrated in FIG. 2, FIG. 4A illustrating enlarged schematic views of conductor patterns, FIG. 4B illustrating cross-sectional photographs of the conductor pattern;

DETAILED DESCRIPTION OF THE EMBODIMENTS

Figure 1:
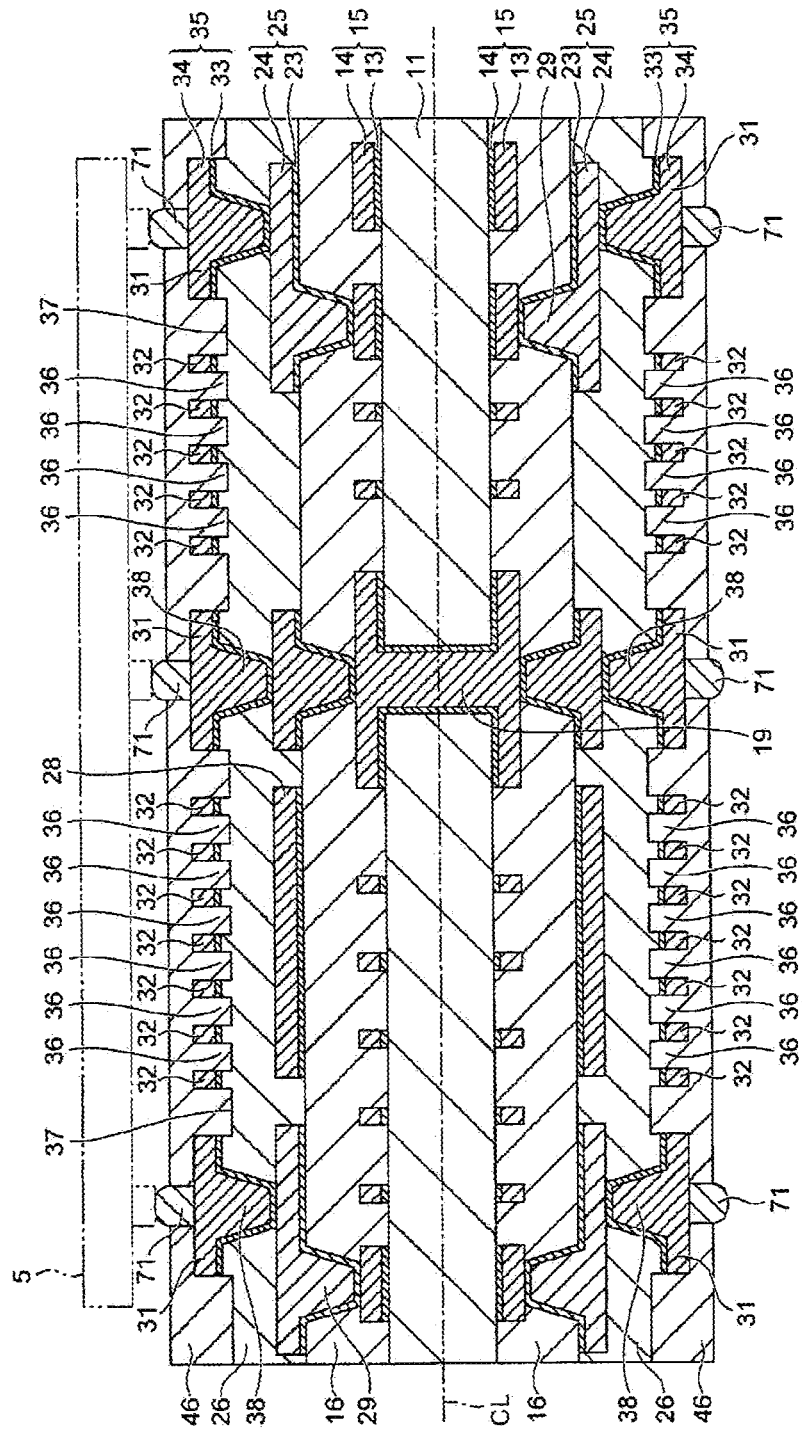
FIG. 1 illustrates a schematic cross-sectional view of a printed wiring board according to a first embodiment of the present invention.

The embodiments will now be described with reference to the accompanying drawings, wherein like reference numerals designate corresponding or identical elements throughout the various drawings.

First Embodiment

Printed Wiring Board

As illustrated in FIG. 1, a printed wiring board (1A) according to the present embodiment is a plate-like or film-like component in which an electronic circuit is formed by fixing an electronic component such as a semiconductor element on a surface and connecting the electronic component with a conductor pattern (conductor wiring). In the present embodiment, the printed wiring board (1A) is a multilayer laminated wiring board.

Specifically, the printed wiring board (1A) is a build-up multilayer laminated wiring board that is formed such that a core substrate 11 is sandwiched by alternately laminating insulating layers and conductor layers on each side of the core substrate 11, and the two sides of the printed wiring board (1A) are electrically connected via a through-hole conductor 19. In the present embodiment, the printed wiring board (1A) has a structure that is vertically symmetrical about a central axis (CL) of the core substrate 11. Therefore, in the following description, only an upper side (one side) above the central axis (CL) is described. In the present embodiment, the printed wiring board (1A) has the structure that is vertically symmetrical about the central axis (CL). However, in accordance with an electronic component to be connected, the printed wiring board (1A) may also have an asymmetric structure. The structure of the printed wiring board (1A) is not limited.

Further, in the present embodiment, an example is illustrated in which one electronic component 5 is mounted. However, as in a second embodiment (to be described later), it is also possible that multiple electronic components are mounted. The electronic component 5 is, for example, a semiconductor element such as an MPU (Micro-Processing Unit) or a DRAM (Dynamic Random Access Memory).

A first conductor layer 15 is formed on a surface of the core substrate 11. The first conductor layer 15 is formed by sequentially laminating a seed layer 13 and an electroplating layer 14. The seed layer 13 is a layer formed of copper, titanium, a titanium compound (such as titanium nitride), nickel or chromium, and may also be formed by laminating multiple layers of these materials. The electroplating layer 14 can be formed, via the seed layer 13, on the surface of the core substrate 11 that is formed of an insulating material. Such a seed layer 13 can be formed by electroless plating, sputtering or the like. The electroplating layer 14 is formed on the seed layer 13 by electrolytic copper plating. The electroplating layer is a layer made of metallic material such as copper. The first conductor layer 15 is covered by a first insulating layer 16. The core substrate and the first insulating layer 16 are formed of a thermosetting epoxy resin or a photosensitive resin containing 30-80% by mass of inorganic filler.

A first conductor via 29 that is electrically connected to the first conductor layer 15 is formed in the first insulating layer 16, and a second conductor layer 25 is formed on a surface of the first insulating layer 16. The second conductor layer 25, similar to the first conductor layer 15, is a layer formed by sequentially laminating a seed layer 23 and an electroplating layer 24, and is a layer made of the same metallic material as the first conductor layer. The second conductor layer 25 is covered by a second insulating layer 26.

In this way, by providing the second insulating layer 26, the first conductor layer 15 and the second conductor layer 25 become inner conductor circuit layers that are on an opposite side of a third conductor layer 35 (to be described later) across the second insulating layer 26. In the present embodiment, the second conductor layer 25, which is an inner conductor circuit layer, further has a planar (thin film-like) conductor layer 28 that extends in an array direction of conductor patterns (32, 32, . . . ). The planar conductor layer 28 is electrically connected to a ground layer (not illustrated in the drawings) that forms a portion of the second conductor layer 25.

Here, the second insulating layer 26 is formed of a photosensitive resin that contains polyimide resin and nano filler such as silica, rubber or the like, the nano filler having an average particle size of 1 nm-100 nm. An epoxy resin containing silica filler having an average particle size of 500 nm or more may also be used. The second insulating layer 26 is formed of an insulating material having a water absorption rate of 1.0% by mass or less. However, it is not always necessary to contain filler. Here, the water absorption rate in the present specification is a water absorption rate of resin measured using a measurement method in conformity with the JIS K 7209-A method. As such a resin, for example, photosensitive polyimide, photosensitive polybenzoxazole, photosensitive phenol, photosensitive epoxy resin, photosensitive cycloolefin, photosensitive benzocyclobutene and the like can be used. For example, in the case of a phenolic resin, the ELPAC (registered trademark) WPR series from JSR Corporation can be used; in the case of an epoxy resin, the INTERVIA (registered trademark) series from Dow Chemical Company can be used; in the case of a cycloolefin resin, the ZEOCOAT series from ZEON Corporation can be used; and in the case of a polyimide resin, the Photoneece series from TORAY Industries, Inc. can be used. Further, the water absorption rate of an insulating resin can be adjusted by adjusting a density of the resin and a number of functional groups such as a hydroxyl group.

The third conductor layer 35 that is positioned outermost among the conductor layers is formed on the second insulating layer 26. The third conductor layer 35 is formed by sequentially laminating a seed layer 33 and an electroplating layer 34. The seed layer 33, as described above, is a layer formed of copper, titanium, a titanium compound (titanium nitride), nickel or chromium, and may also be formed by laminating multiple layers of these materials. By providing such a seed layer 33, the electroplating layer 34 can be formed, via the seed layer 33, on a surface of the second insulating layer 26.

Here, when a layer made of titanium, a titanium compound, nickel or chromium is used for the seed layer 33, as compared to a layer made of copper, occurrence of ion migration (to be described later) can be suppressed. When the seed layer 33 is formed of copper or nickel, the seed layer 33 can be formed by electroless plating. When the seed layer 33 is formed of titanium or a titanium compound (such as titanium nitride), the seed layer 33 can be formed by sputtering or the like. The electroplating layer 34 is formed on the seed layer 33 by electrolytic copper plating. The third conductor layer 35 is covered by a solder resist layer 46. Further, a solder bump 71 for electrically connecting a conductor pad 31 of the third conductor layer 35 (to be described later) and the electronic component 5 is positioned in the solder resist layer 46.

The third conductor layer 35 is formed by multiple conductor pads (31, 31, . . . ) that are electrically connected to the electronic component 5 and multiple conductor patterns (conductor wirings) (32, 32, . . . ) that are formed in a line-and-space-like shape between the conductor pads (31, 31). Each conductor pad 31 is electrically connected the second conductor layer 25 via a second conductor via 29 that is formed inside the second insulating layer 26. Upper surfaces of the conductor pads (31, 31, . . . ) and upper surfaces of the conductor patterns (32, 32, . . . ) are positioned on the same plane. As a result, unevenness of the solder resist layer 46 can be reduced, and mountability of the electronic component 5 can be improved.

Figure 3:
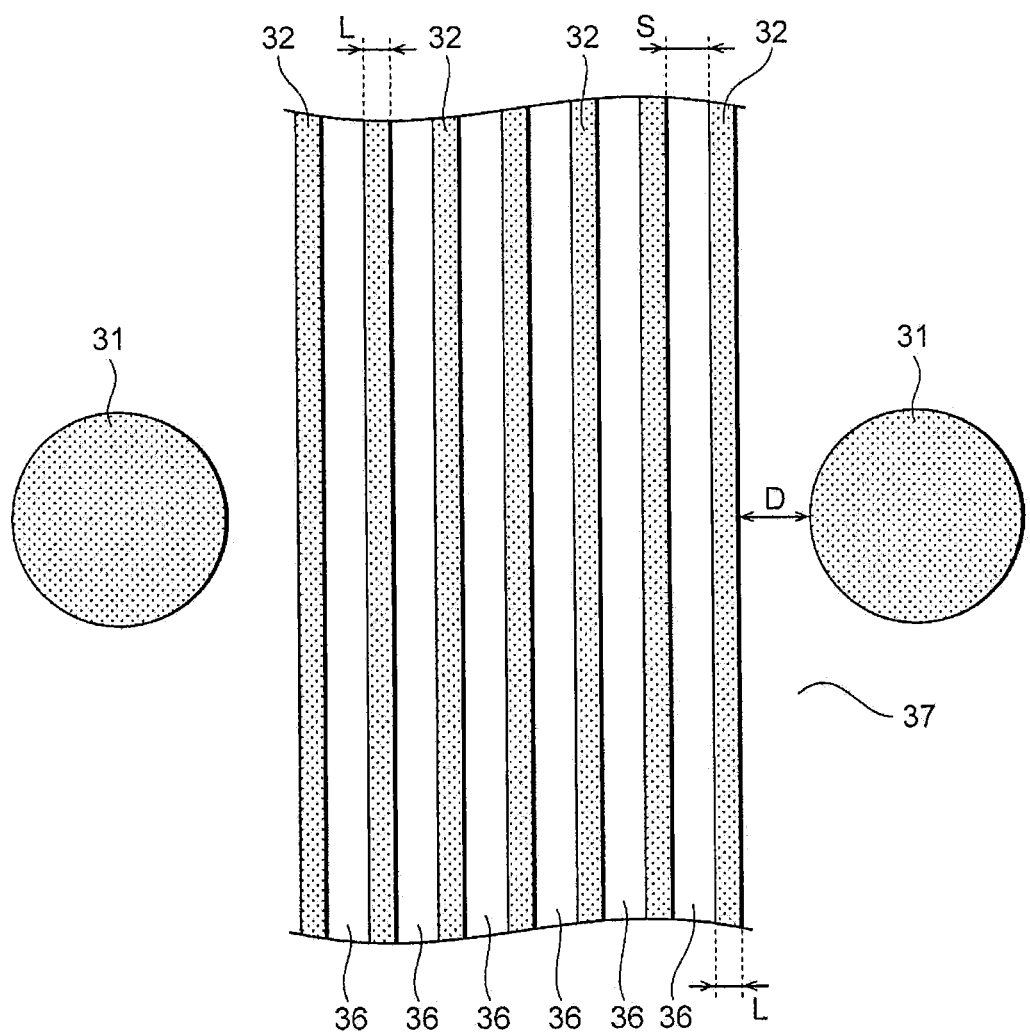
FIG. 3 is a cross-sectional view taken along an arrow line A-A in a vicinity between conductor pads illustrated in FIG. 2.

As illustrated in FIG. 3, the conductor patterns (32, 32) each have a pattern width (L) of 3 μm or less, and a pattern interval (S) between adjacent conductor patterns (32, 32) is 3 μm or less. That is, in the present embodiment, the conductor patterns (32, 32) have a line and space (L/S) of (3 μm)/(3 μm) or less. More preferably, the pattern width (L) is 0.5 μm or more, and the pattern interval (S) is 0.5 μm or more. That is, the line and space (L/S) of the conductor patterns (32, 32) is (0.5 μm)/(0.5 μm) or more.

Figure 2:
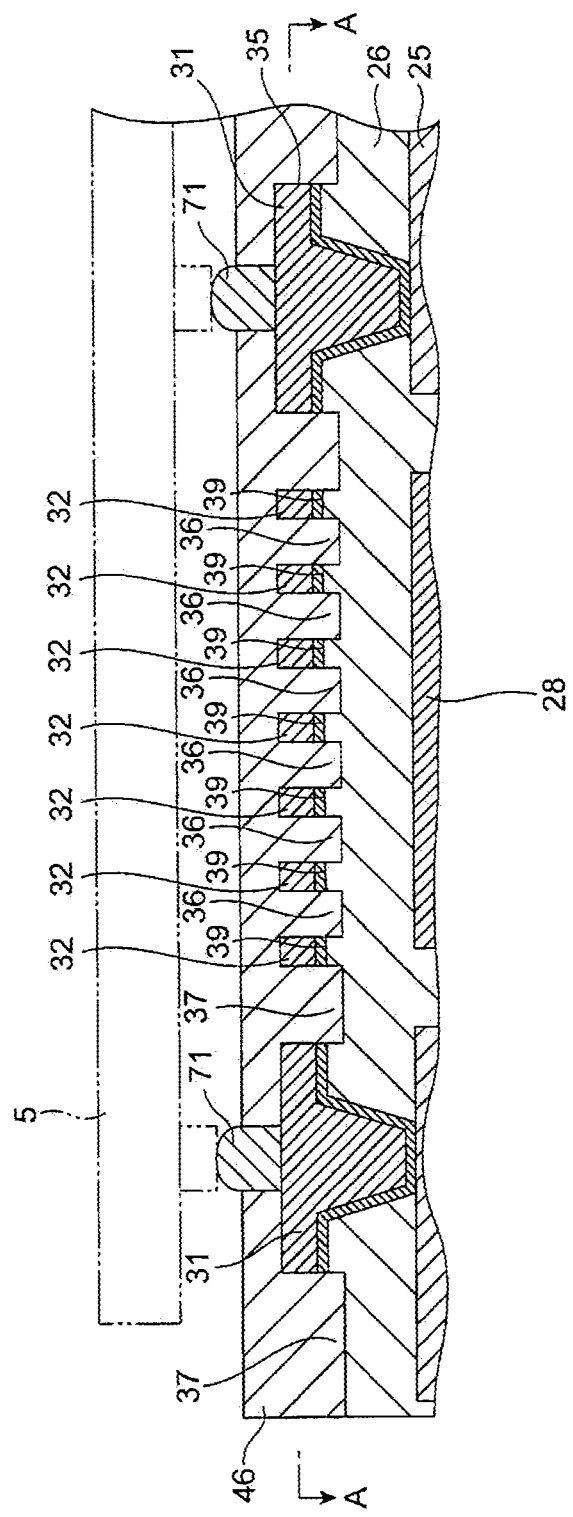
FIG. 2 is a partial enlarged view of an outermost layer of the printed wiring board illustrated in FIG. 1.

Further, as illustrated in FIG. 2, on the surface of the second insulating layer 26 between the conductor patterns (32, 32), a recess 36 that is recessed relative to a contact interface 39 at which the conductor patterns 32 and the second insulating layer 26 are in contact with each other is formed at a position along the conductor patterns 32. In the present embodiment, a surface 38 of the second insulating layer 26 other than the contact interface at which the second insulating layer 26 is in contact with the third conductor layer 35 is recessed at a depth (d) in a range of 0.1-2.0 μm relative to the contact interface 39.

Such a recess 36 can be obtained by etching the surface 38 of the second insulating layer 26 using a RIE method (reactive ion etching method) after the third conductor layer 35 is formed by sequentially laminating the seed layer 33 and the electroplating layer 34 on the second insulating layer 26, as illustrated in diagrams on left sides of FIGS. 4A and 4B, that is, after the conductor patterns (32, 32, ...) are formed on the planar surface of the second insulating layer 26.

Specifically, the etching is performed by causing ion species or radical species in a plasma of an etching gas to be in contact with the surface 38 of the second insulating layer 26 other than the contact interface 39 at which the second insulating layer 26 is in contact with the third conductor layer 35, and causing the surface 38 to react with the etching gas. Anisotropic etching can be performed using the RIE method. Therefore, after the etching, as illustrated in diagrams on right sides of FIGS. 4A and 4B, the recess (recessed groove) 36 having a width substantially the same as the pattern interval (S) of the conductor patterns (32, 32) can be formed.

Further, the recess 36 may also be formed by etching using an ashing method. In this case, the recess 36 can be obtained by causing an etching gas such as an ozone gas to be in contact with the surface 38 of the second insulating layer 26 other than the contact interface 39 at which the second insulating layer 26 is in contact with the third conductor layer 35. Isotropic etching can be performed etching using the ashing method. Therefore, after the etching, as illustrated in diagrams on right sides of FIGS. 4A and 4B, depressed portions (36a) are formed in the recess 36 such that a width (w) of the recess 36 in the same direction as a direction of the pattern width (L) of the conductor patterns 32 is wider than the pattern interval (S) between the conductor patterns.

Operation Effect of Printed Wiring Board of First Embodiment

Here, for example, as illustrated in the diagrams on the left sides of FIGS. 4A and 4B, in the state before etching is performed, the contact interface 39 between the conductor patterns 32 and the second insulating layer 26 and the surface 38 of the second insulating layer 26 between the conductor patterns (32, 32) are formed on substantially the same plane. The conductor patterns (32, 32, ...) are formed each having a pattern width of 3 μm or less and having a pattern interval of 3 μm of less between the conductor patterns (32, 32). Therefore, as illustrated in FIG. 6A, among electric fields formed between adjacent conductor patterns (32, 32), an electric field (E1) having a strong electric field strength is formed along the surface 38 of the second insulating layer 26 between the conductor patterns (32, 32). As a result, the metal (specifically, copper ions) that forms the conductor patterns is likely to deposit, while moving, on the surface 38 of the second insulating layer 26 between the conductor patterns (32, 32). That is, ion migration is likely to occur between the conductor patterns (32, 32).

Figure 5A:
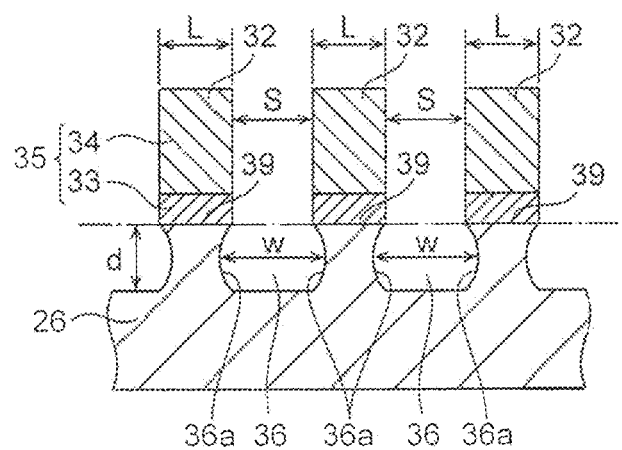
FIG. 5A is an enlarged schematic view illustrating a state of a recess according to another embodiment.
Figure 5B:
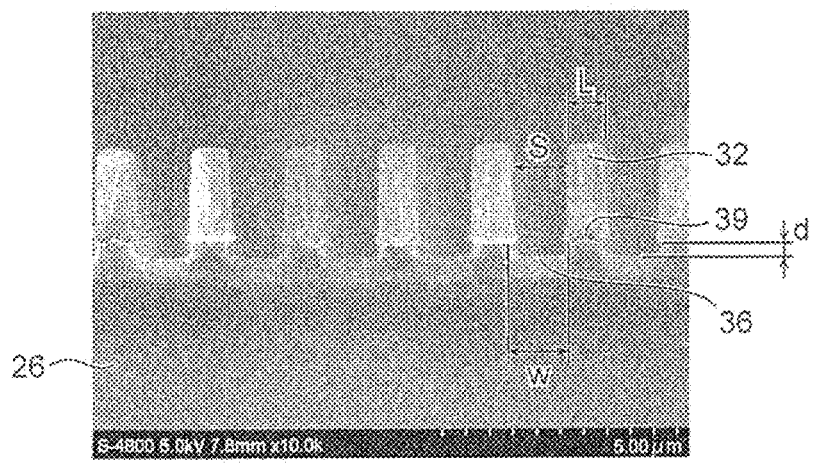
FIG. 5B is a cross-sectional photograph of a conductor pattern according to the other embodiment.

However, in the present embodiment, after the third conductor layer 35 is formed on the surface of the second insulating layer 26 such that, as illustrated in the diagrams on the left sides of FIGS. 4A and 4B, the pattern width (L) of the conductor patterns 32 is 3 μm or less and the pattern interval (S) between adjacent conductor patterns (32, 32) is 3 μm or less, the following etching is performed. Specifically, as illustrated in the diagrams on the right sides of FIGS. 4A and 4B (or, in FIGS. 5A and 5B), by performing etching, the recess 36 that is recessed at the depth (d) in a range of 0.1-2.0 μm relative to the contact interface 39 at which the conductor patterns 32 and the second insulating layer 26 are in contact with each other is formed in the second insulating layer 26 between adjacent conductor patterns (32, 32).

Figure 6B:
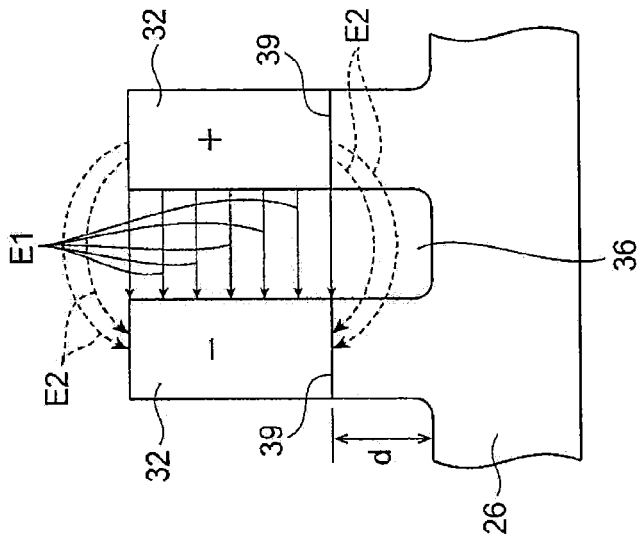
FIG. 6B is a schematic diagram for describing a state of a conductor pattern according to the present embodiment.
Figure 6A:
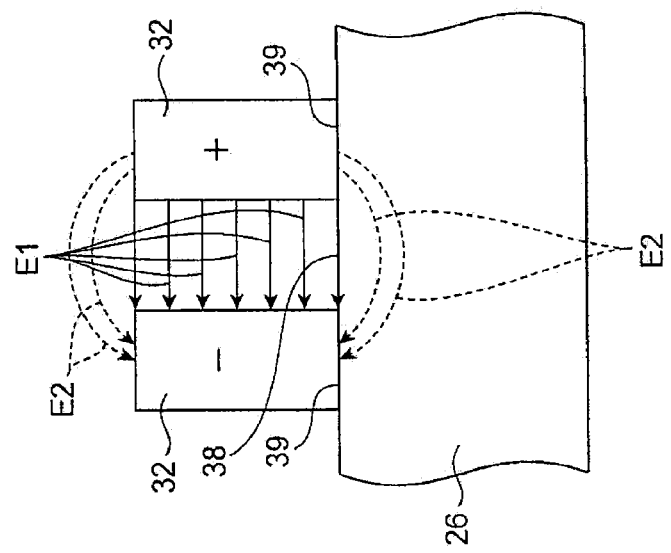
FIG. 6A is a schematic diagram for describing a state of a conventional conductor pattern.

As a result, as illustrated in FIG. 6B, a surface of the recess 36 (the surface of the second insulating layer 26 between the conductor patterns) is offset from where the electric field (E1) having strong electric field strength is formed among the electric fields formed between the conductor patterns (32, 32). As a result, an electric field formed near the surface of the recess 36 is an electric field (E2) that is weaker than the electric fields formed between the conductor patterns. Therefore, the metal (specifically, copper ions) that forms the conductor patterns 32 is less likely to deposit. Further, voids are formed or an insulating material is further filled in between the conductor patterns (32, 32) and the recess 36. Therefore, the metal of the conductor patterns 32 is less likely to move between adjacent conductor patterns (32, 32). In this way, ion migration between adjacent conductor patterns (32, 32) can be reduced, and short circuiting between adjacent conductor patterns (32, 32) can be reduced. Further, not only between the conductor patterns (32, 32), but also at where a conductor pad 31 and a conductor pattern 32 are formed to be close to each other, a recess similar to the recess 36 is formed. Therefore, ion migration between the conductor pads 31 and the conductor patterns 32 can also be reduced.

Here, when the depth (d) of the recess 36 is less than 0.1 μm, a sufficient ion migration reduction effect due to the formation of the recess 36 cannot be expected. When the depth (d) of the recess 36 exceeds 2.0 not only it is difficult to expect further improvement in the ion migration reduction effect due to the formation of the recess 36, but also a conductor pattern 32 is likely to fall down to the recess 36 side and it is difficult to form the recess 36 in the second insulating layer 26.

Further, in the present embodiment, the insulating material that forms the second insulating layer 26 has a water absorption rate of 1.0% by mass or less. Therefore, movement of the metal of the conductor patterns can be further suppressed between the conductor patterns. Further, Not only the second insulating layer 26, an insulating material having a water absorption rate of 1.0% by mass or less as an upper-layer insulating layer of the second insulating layer 26 may be filled in between the conductor patterns (32, 32). As a result, movement of the metal (specifically, copper) between the conductor patterns (32, 32) can be further suppressed.

Further, as described above, the planar conductor layer 28 is formed at a position on a side of the second insulating layer 26 opposite to the side where the conductor patterns (32, 32, ...) are densely arrayed and extends along the array direction of the conductor patterns (32, 32, ...). Therefore, a microstrip line can be formed in the printed wiring board (1A). Further, due to the planar conductor layer 28, heat transmitted from the electronic component 5 can be dissipated and ion migration can be reduced. In particular, in the present embodiment, the planar conductor layer 28 is electrically connected to the ground layer. Therefore, a further improved effect of the microstrip line can be expected.

Other Modified Embodiments

In the first embodiment illustrated in FIG. 1, the recess 36 is provided between the conductor patterns (32, 32) of the third conductor layer 35 that is the outermost layer of the conductor layers. However, for example, it is also possible that, instead of the planar conductor layer 28 of the second conductor layer, multiple conductor patterns similar to the conductor patterns (32, . . . ) of the third conductor layer 35 are provided and a recess is provided in the first insulating layer 16 between the conductor patterns. Further, a recess is also provided on an opposite side, across the center line (CL), of the side where the electronic component 5 is mounted. However, it is not always necessary to provide a recess in an insulating layer on the opposite side. Further, the pattern width (L) and the pattern interval (S) of the conductor patterns on the opposite side across the center line (LC) may be respectively wider than those of the conductor patterns (32, 32, . . . ) on the electronic component 5 side.

Further, in the present embodiment, the insulating layers and the conductor layers are alternately provided in the printed wiring board. However, the printed wiring board may also be a printed wiring board that is formed by the second insulating layer 26 and the third conductor layer 35 formed on the second insulating layer 26, and insulating layers and conductor layers may be further alternately laminated on the third conductor layer 35.

Second Embodiment

Figure 7:
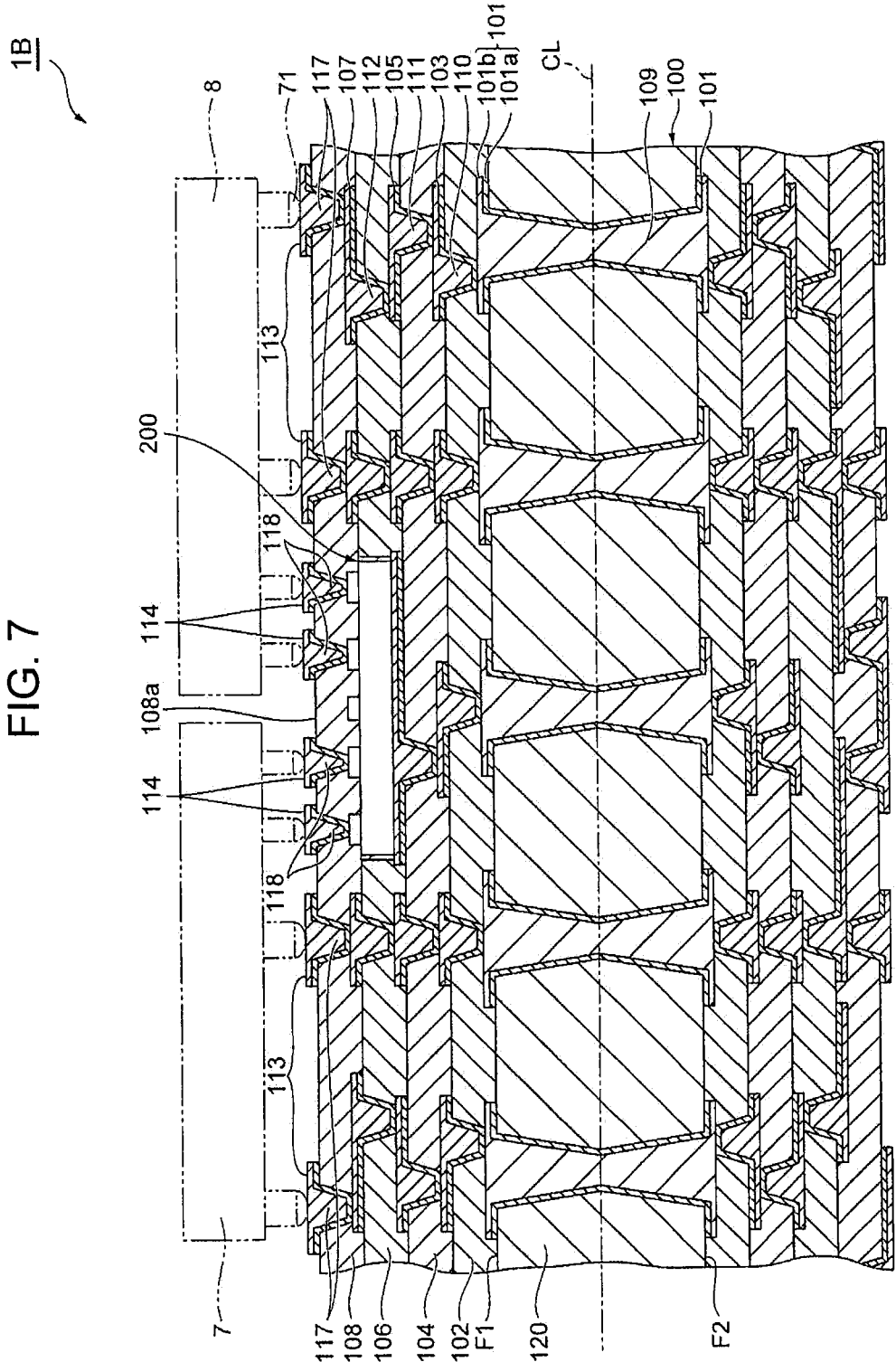
FIG. 7 is a schematic cross-sectional view of a printed wiring board according to a second embodiment of the present invention.
Figure 8:
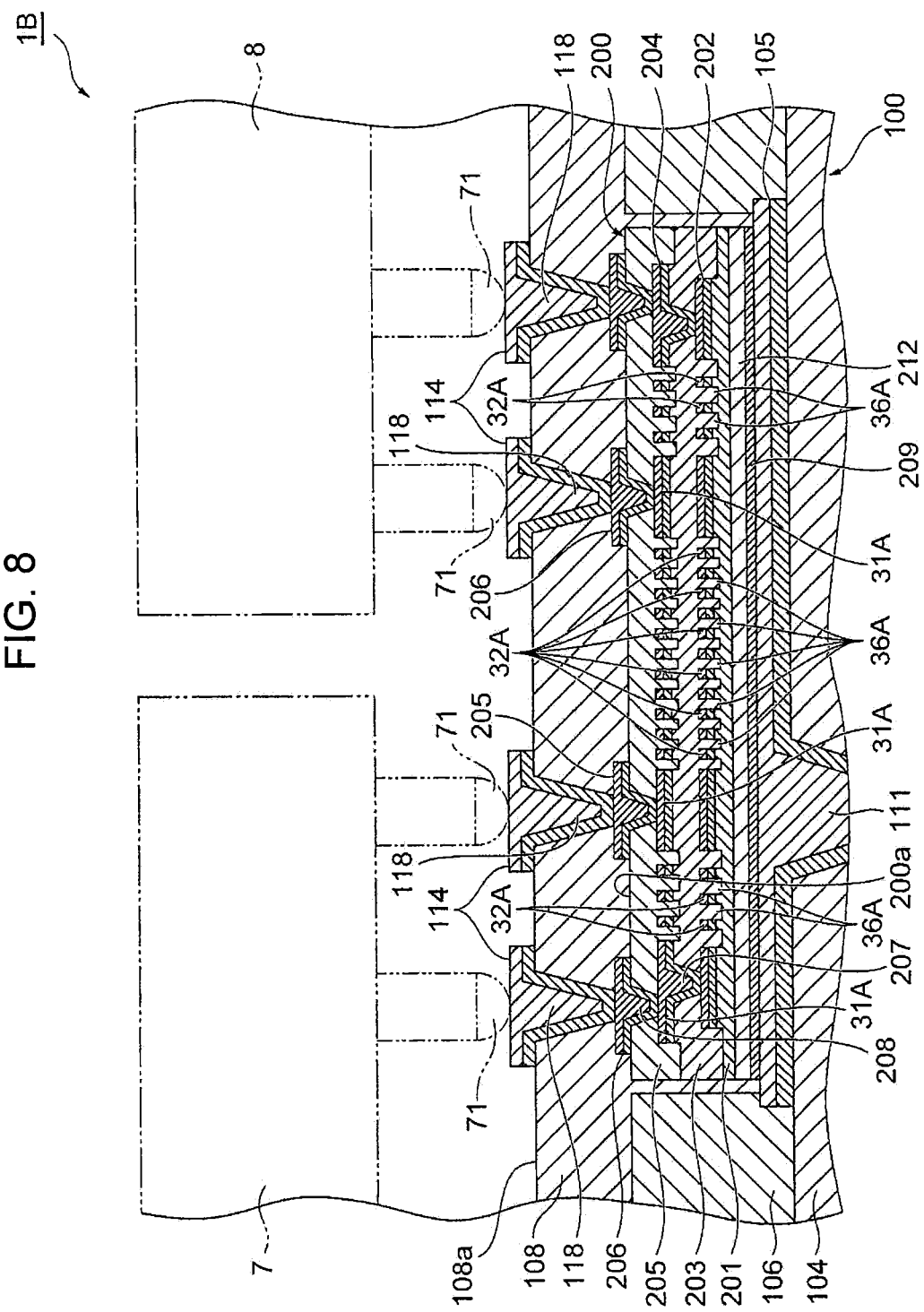
FIG. 8 is an enlarged cross-sectional view illustrating a sub wiring board of FIG. 7.
Figure 9:
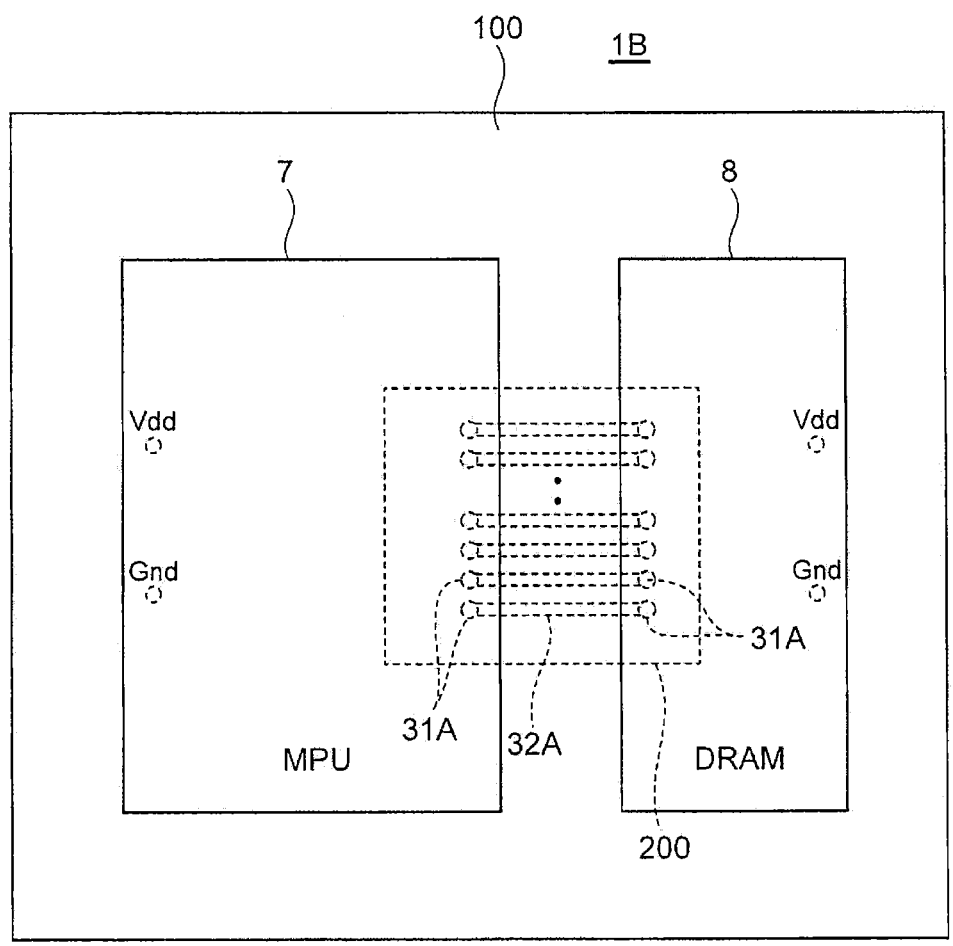
FIG. 9 is a schematic plan view of the printed wiring board illustrated in FIG. 7.
Figure 10:
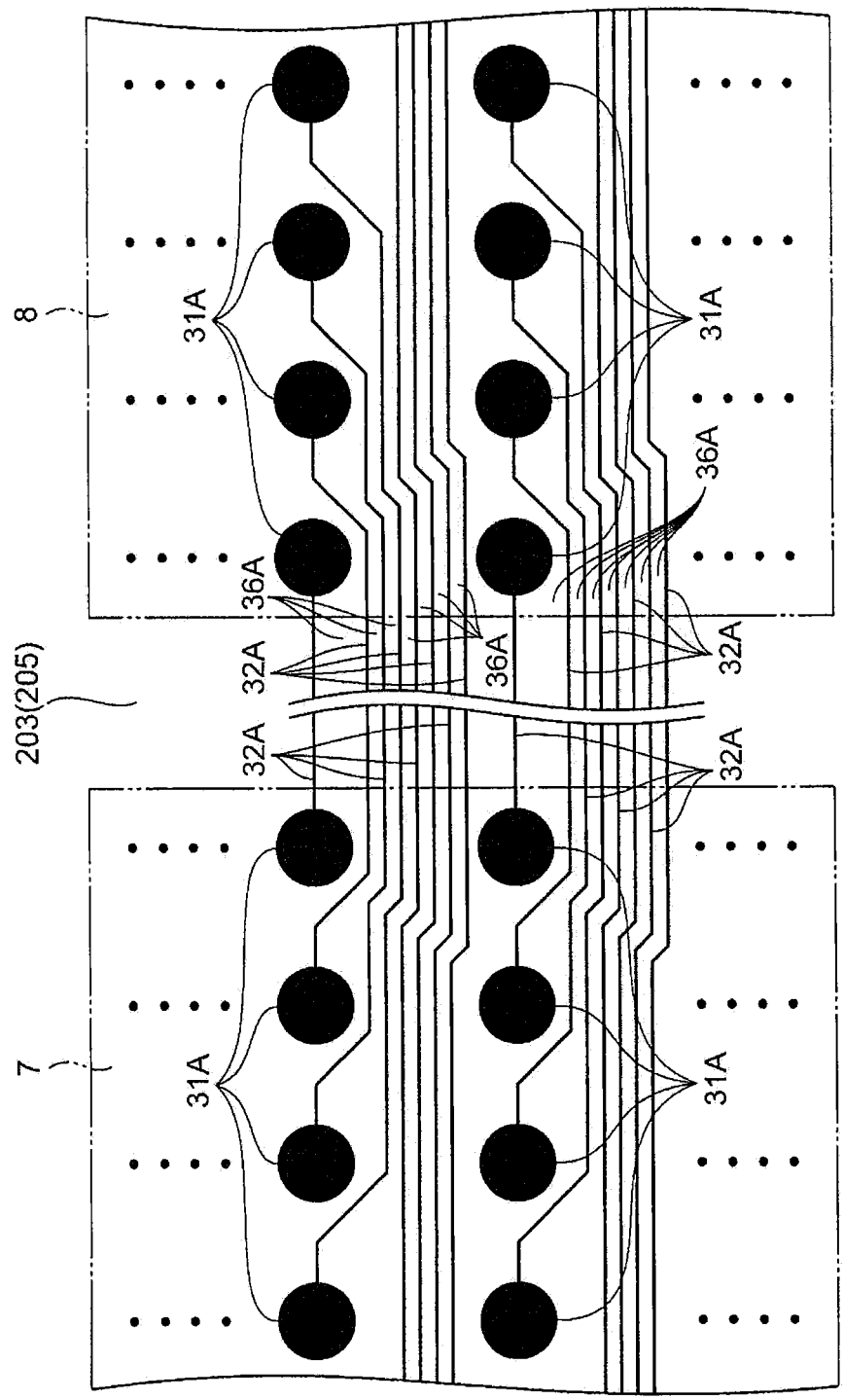
FIG. 10 is a schematic diagram illustrating a state of a sub conductor pattern between two electronic components illustrated in FIG. 9.

FIG. 7 is a schematic cross-sectional view of a printed wiring board according to a second embodiment of the present invention. FIG. 8 is an enlarged cross-sectional view illustrating a sub wiring board of FIG. 7. FIG. 9 is a schematic plan view of the printed wiring board illustrated in FIG. 7. FIG. 10 is a schematic diagram illustrating a state of a sub conductor pattern between two electronic components illustrated in FIG. 9.

As illustrated in FIG. 7, a printed wiring board (1B) according to the second embodiment includes a main wiring board 100 and a sub wiring board 200. The main wiring board 100 is a multilayer laminated wiring board in which insulating layers and conductor layers are alternately laminated. The sub wiring board 200 is formed (in the present embodiment, is embedded) in the main wiring board 100, multiple sub conductor patterns, which are finer patterns than those of the main wiring board 100, being formed in the sub wiring board 200. As illustrated in FIG. 9, as electronic components, a first semiconductor element (MPU) 7 and a second semiconductor element (for example, a DRAM) 8, which are adjacent to each other, are electrically connected via multiple sub conductor patterns (32A) of the sub wiring board 200. In the present embodiment, a semiconductor device is a device in which the first semiconductor element 7 and the second semiconductor element 8 are mounted on the printed wiring board (1B). In the present embodiment, the two electronic components are illustrated. However, for example, it is also possible that another electronic component (semiconductor element) is further electrically connected to the first semiconductor element (MPU) 7 via sub conductor patterns (32A) of another sub wiring board.

Main Wiring Board

The main wiring board 100 is a build-up multilayer laminated wiring board that is formed by alternately laminating main insulating layers and main conductor layers, across a core substrate 120, on both main surfaces (F1, F2) of the core substrate 120. The main wiring board 100, except a portion where the sub wiring board 200 is embedded, is formed by sequentially laminating layers that have the same functions by the same processes across a central axis (CL) of the core substrate 120. Therefore, in the following description, only one side (only the main surface (F1) side) is used for the description.

A first main conductor layer 101 that includes an electroless plating layer (101a) and an electrolytic plating layer (101b) is formed on the core substrate 120. The first main conductor layer 101 is covered by a first main insulating layer 102 that is formed on the first main conductor layer 101. The first main insulating layer 102 is formed of, for example, a thermosetting epoxy resin.

On the first main insulating layer 102, a second main conductor layer 103, a second main insulating layer 104 that covers the second main conductor layer 103, third main conductor layer 105, a third main insulating layer 106 that covers the third main conductor layer 105, a fourth main conductor layer 107, and a fourth main insulating layer 108 that covers the fourth main conductor layer 107 are further laminated in this order. The second main conductor layer 103, the third main conductor layer 105 and the fourth main conductor layer 107 are each formed from an electroless plating layer and an electrolytic plating layer, similar to the first main conductor layer 101. On the other hand, the second main insulating layer 104, the third main insulating layer 106 and the fourth main insulating layer 108 are each formed of a thermosetting epoxy resin, similar to the first main insulating layer 102.

Further, multiple first main via conductors 110, multiple second main via conductors 111, and multiple third main via conductors 112 are respectively formed in the first main insulating layer 102, the second main insulating layer 104 and the third main insulating layer 106. Each of the main via conductors (110, 111, 112) is formed in a truncated cone shape, and is formed to penetrate through the main insulating layer in which the main via conductor is formed. The first main conductor layer 101 and the second main conductor layer 103 are electrically connected to each other by the first main via conductors 110 formed therebetween. The second main conductor layer 103 and the third main conductor layer 105 are electrically connected to each other by the second main via conductors 111 formed therebetween. The third main conductor layer 105 and the fourth main conductor layer 107 are electrically connected to each other by the third main via conductors 112 formed therebetween. The first main conductor layer 101 that is formed on the main surface (F1) of the core substrate 120 is electrically connected, via through-hole conductors 109 that are provided in the core substrate 120, to the first main conductor layer 101 formed on the main surface on the opposite side.

As illustrated in FIG. 9, some of the main via conductors (110, 111, 112, 117) and the through-hole conductors 109 form stacked conductor vias. Specifically, the main via conductors (110, 111, 112, 117) and the through-hole conductors 109 that are adjacent to the sub wiring board 200 are stacked along a lamination direction of the main wiring board 100 and form the stacked conductor vias.

The sub wiring board 200 is embedded in the main wiring board 100. The sub wiring board 200 is positioned on a planar copper layer of the third main conductor layer 105 of the main wiring board 100, and is positioned in parallel to the fourth main conductor layer 107 and the third main via conductors 112. The sub wiring board 200, together with the fourth main conductor layer 107, is covered by the fourth main insulating layer 108 of the main wiring board 100 (the fourth main insulating layer 108 being the outermost layer of the multilayer wiring board), and is sealed inside the main wiring board 100.

Multiple first main conductor pads 113 and multiple second main conductor pads 114 for mounting the first semiconductor element 7 and the second semiconductor element 8 that are adjacent to each other are formed on an upper surface (108a) of the fourth main insulating layer 108. Upper surfaces of the first main conductor pads 113 and the second main conductor pads 114 are positioned on the same plane. The first main conductor pads (113, 113, . . . ) and the second main conductor pads (114, 114, . . . ) are positioned in parallel at predetermined intervals. The first main conductor pads 113 are electrically connected via the fourth main via conductors 117 that are provided in the fourth main insulating layer 108. The second main conductor pads 114 are electrically connected, via fifth main via conductors 118 that are provided in the fourth main insulating layer 108, to the sub wiring board 200 that is positioned below the second main conductor pads 114.

Sub Wiring Board

The sub wiring board 200 has a rectangular cross section and is formed in a shape of a cuboid three-dimensionally, and is fixed on the third main conductor layer 105 of the main wiring board 100 via a die attach film (bonding layer) 209 that is positioned at a bottom of the sub wiring board 200. A heat dissipation member 212 and a first sub insulating layer 201 are sequentially positioned on the die attach film 209. In the present embodiment, the heat dissipation member 212 is provided. However, the heat dissipation member 212 may be provided as needed, and can be omitted as illustrated in a third and a fourth embodiments to be described later.

Here, it is preferable that the heat dissipation member 212 have a thickness in a range of 10-80 μm. In addition to a copper plating layer, the heat dissipation member 212 may also be formed using another metal plating layer, a metal plate or a nano carbon material. By providing the heat dissipation member 212, heat generated during operation of the first and second semiconductor elements (7, 8) can be efficiently released to surroundings via the heat dissipation member 212, and an effect of suppressing influence due to a thermal stress can be achieved. As a result, reliability of the printed wiring board (1B) can be further improved.

Further, on the first sub insulating layer 201, a first sub conductor layer 202, a second sub insulating layer 203, a second sub conductor layer 204 and a third sub insulating layer 205 are laminated in this order. The first sub conductor layer 202 and the second sub conductor layer 204 are electrically connected via first sub conductor vias 207 that are formed in the second sub insulating layer 203.

Here, the first sub conductor layer 202 and the second sub conductor layer 204 are each formed from a seed layer and a copper plating layer. The first sub conductor layer 202 and the second sub conductor layer 204 include multiple sub conductor pads (31A, 31A, . . . ). Between the sub conductor pads (31A, 31A), the sub conductor patterns (32A, 32A, . . . ) having a pattern width and a pattern interval narrower than those of conductor patterns (not illustrated in the drawings) of the conductor layers (101, 103, 105, 107) of the main wiring board 100 are formed.

The sub conductor pads (31A) have the same structure as that of the conductor pads 31 illustrated in the first embodiment. The sub conductor patterns (32A) have the same structure as that of the conductor patterns 32 illustrated in the first embodiment. Therefore, similar to the first embodiment, the sub conductor patterns (32A, 32A, . . . ) have a pattern width (L) of 3 μm or less and a pattern interval (S) of 3 μm or less between adjacent conductor patterns (32A, 32A).

Similar to the first embodiment, on a surface of the first sub insulating layer 201 between the sub conductor patterns (32A, 32A), a recess (36A) that is recessed relative to a contact interface at which the sub conductor patterns (32A, 32A) and the first sub insulating layer 201 are in contact with each other is formed at a position along the sub conductor patterns (32A). Also on a surface of the second sub insulating layer 203, similar to the first sub insulating layer 201, the sub conductor pattern (32A) are formed. On the surface of the second sub insulating layer 203, a recess (36A) similar to that of the first sub insulating layer 201 is formed. The recess (36A) according to the present embodiment has the same structure as that of the recess 36 illustrated in the first embodiment. Therefore, the recess (36A) has a depth in a range of 0.1-2.0 μm, and the surface of the second sub insulating layer 203 (third sub insulating layer 205) other than the contact interface at which the first sub insulating layer 201 (second sub insulating layer 203) is in contact with the sub conductor pads (31A, 31A) and the sub conductor patterns (32A) is recessed at a uniform depth in a range of 0.1-2.0 μm relative to the contact interface.

As illustrated in the second insulating layer 26 of the first embodiment, the first sub insulating layer 201, the second sub insulating layer 203 and the third sub insulating layer 205 are each an insulating layer that is formed of a photosensitive resin and an insulating material having a water absorption rate of 1.0% by mass or less. By using photosensitive resin layers, small-diameter via holes and narrow-pitch sub conductor patterns can be easily formed in the sub insulating layers. Further, the second sub insulating layer 203 is laminated such that the insulating material (having a water absorption rate of 1.0% by mass or less) that forms the second sub insulating layer 203 is filled in between the sub conductor patterns (32A, 32A, . . . ) that are formed on the surface of the first sub insulating layer 201. Further, the third sub insulating layer 205 is laminated such that the insulating material (having a water absorption rate of 1.0% by mass or less) that forms the third sub insulating layer 205 is filled in between the sub conductor patterns (32A, 32A, . . . ) that are formed on the surface of the second sub insulating layer 203. In this way, by allowing the insulating material that forms the insulating layers to have a water absorption rate of 1.0% by mass or less, movement of the metal (specifically, copper ions) that forms the sub conductor patterns (32A) can be suppressed between the sub conductor patterns (32A, 32A).

Sub conductor pads 206 are formed on an upper surface of the third sub insulating layer 205. The sub conductor pads 206 are electrically connected via sub conductor vias 208 to the sub conductor pads (31A) of the second sub conductor layer 204. The sub conductor pads 206 are electrically connected via the fifth main via conductors 118 to the second main conductor pads 114.

Operation Effect of Printed Wiring Board of Second Embodiment

By structuring this way, the first and second semiconductor elements (7, 8) such as an MPU and a DRAM, that are positioned adjacent to each other can be connected via the sub conductor patterns (32A, 32A, . . . ) that are formed in the sub wiring board 200 and have a narrow pattern width and a narrow pattern interval. Further, due to the first and second semiconductor elements (7, 8), the surface of the sub wiring board 200 tends to have a higher temperature as compared to other portions. However, as described above, between adjacent sub conductor patterns (32A, 32A), the recess (36A) having the depth (d) in the above-described ranged is formed. Therefore, ion migration between the sub conductor patterns can be avoided.

Further, the insulating layers (specifically, the first sub insulating layer 201 and the second sub insulating layer 203), in which the sub conductor patterns (32A, 32A) are formed, are formed of an insulating resin having a water absorption rate of 1.0% by mass or less. Further, the insulating layers (specifically, the second sub insulating layer 203 and the third sub insulating layer 205) that cover the sub conductor patterns (32A, 32A) are also formed of an insulating resin having a water absorption rate of 1.0% by mass or less. Therefore, metal movement between the sub conductor patterns (32A, 32A) can be suppressed.

Third Embodiment

Figure 11:
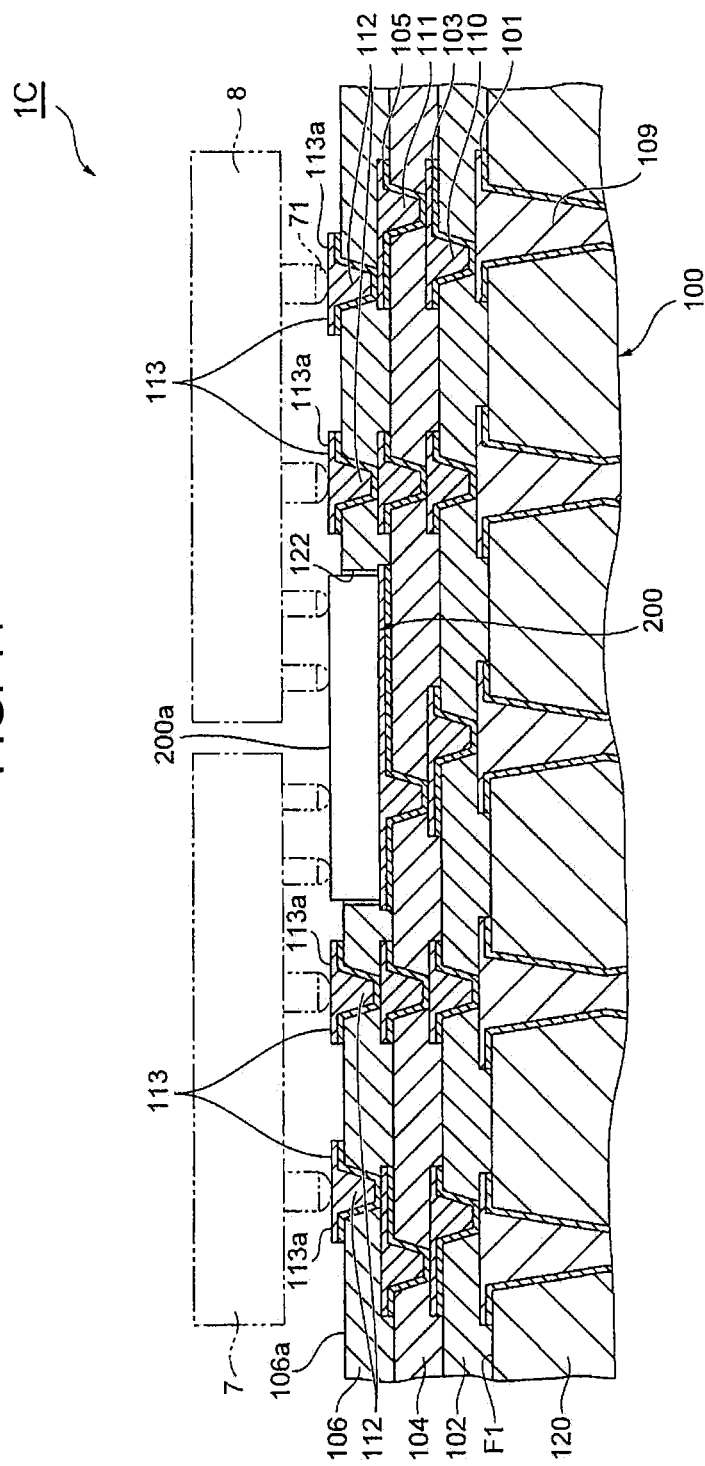
FIG. 11 is a schematic cross-sectional view of a printed wiring board according to a third embodiment of the present invention.
Figure 12:
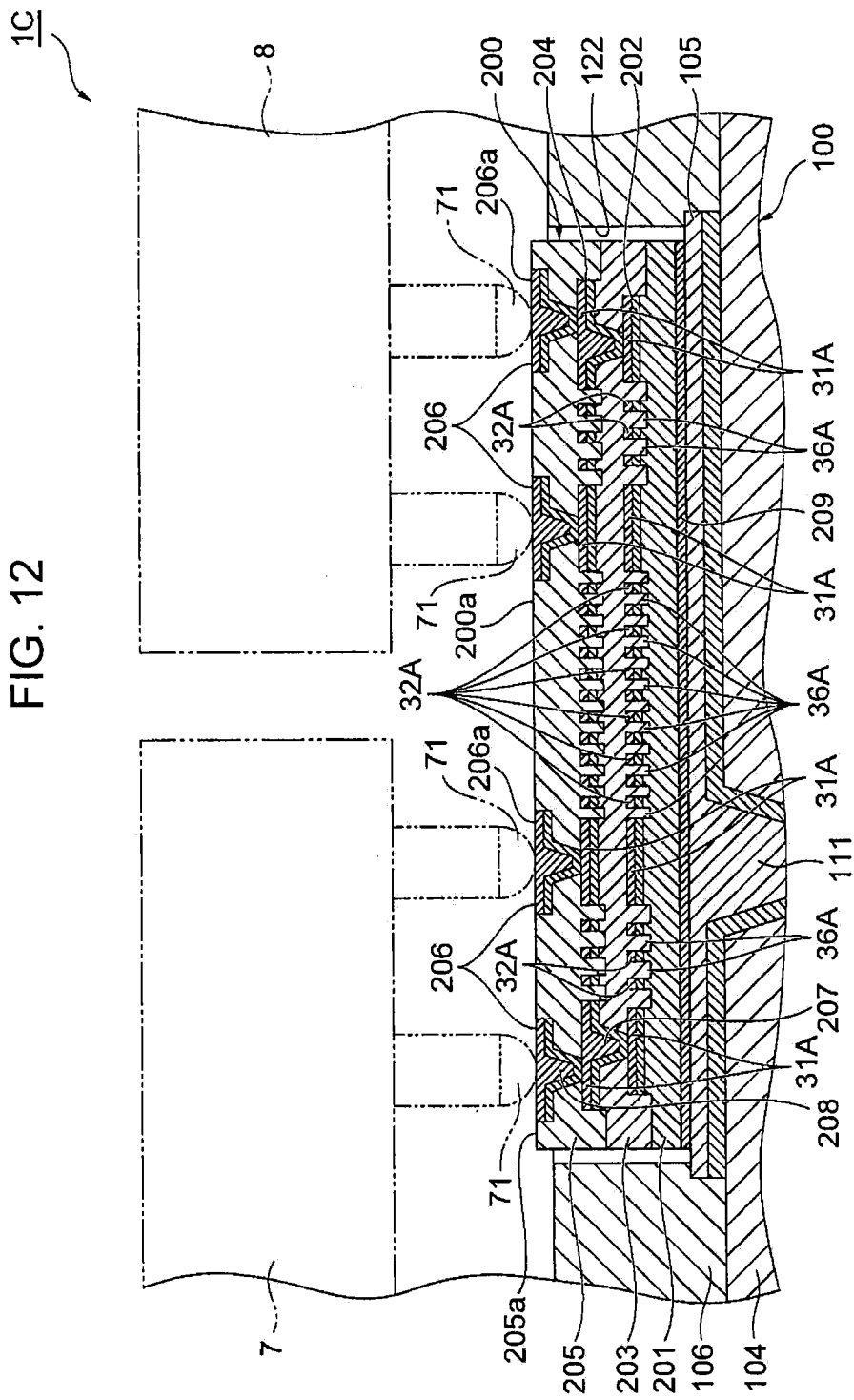
FIG. 12 is an enlarged cross-sectional view illustrating a sub wiring board of FIG. 11.

FIG. 11 is a schematic cross-sectional view of a printed wiring board according to a third embodiment of the present invention. FIG. 12 is an enlarged cross-sectional view illustrating a sub wiring board of FIG. 11. The printed wiring board of the third embodiment is mainly different from the printed wiring board of the second embodiment in that the sub wiring board 200, without being embedded in the main wiring board 100, is exposed to the outside; in that the fourth main conductor layer 107 and the fourth main insulating layer 108 of the main wiring board 100 are not provided (in that, instead of the fourth main conductor layer 107, the first main conductor pads 113 are provided); and in that the heat dissipation member 212 is not provided in the sub wiring board 200. The third embodiment is the same as the second embodiment in that the sub conductor patterns (32A, 32A, . . . ), the recesses (36A, 36A, . . . ) and the like are formed in the sub wiring board 200.

Specifically, the sub wiring board 200 is positioned in a recess 122 provided in the third main insulating layer 106 of the main wiring board 100, and is fixed to the third main conductor layer 105 via the die attach film 209 (see FIG. 12). That is, the sub wiring board 200 according to the present embodiment, without being covered by a main insulating layer, is exposed to the outside. Therefore, the third sub insulating layer 205 of the sub wiring board 200 forms an outermost layer of the printed wiring board (1C).

The sub conductor pads (206, 206, . . . ) that are formed on the third sub insulating layer 205 are exposed to the outside, and the first semiconductor element 7 and the second semiconductor element 8 are mounted via solder bumps 71. Further, an outermost layer of the sub wiring board 200 is a layer that includes the sub conductor pads (outermost conductor pads) 206 that are positioned outermost, and the third sub insulating layer (outermost insulating layer) 205 that is formed of an insulating material and is positioned outermost. Upper surfaces (206a) of the sub conductor pads 206 and an upper surface (205a) of the third insulating layer 205 are formed on the same plane. That is, an upper surface (exposed surface) of the sub wiring board 200 is flat. In this way, by forming the upper surfaces (206a) of the sub conductor pads 206 and the upper surface (205a) of the third insulating layer 205 on the same plane, short circuiting due to soldering between the sub conductor pads 206 can be prevented. Further, mountability of the first semiconductor element 7 and the second semiconductor element 8 can also be improved.

Further, the upper surfaces (206a) of the sub conductor pads 206 (upper surface (200a) of the sub wiring board 200) and upper surfaces (113a) of the first main conductor pads 113 are formed on the same plane, the first main conductor pads 113 being formed on the main wiring board 100 for directly connecting) mounting the first semiconductor element 7 and the second semiconductor element 8 via the solder bumps 71. The mountability of the first semiconductor element 7 and the second semiconductor element 8 can be further improved. Further, similar to the second embodiment, the conductor patterns (32A) and the recesses (36A) are formed in the sub wiring board. Therefore, the same ion migration reduction effect as the effect described in the second embodiment can be expected.

Fourth Embodiment

Figure 13:
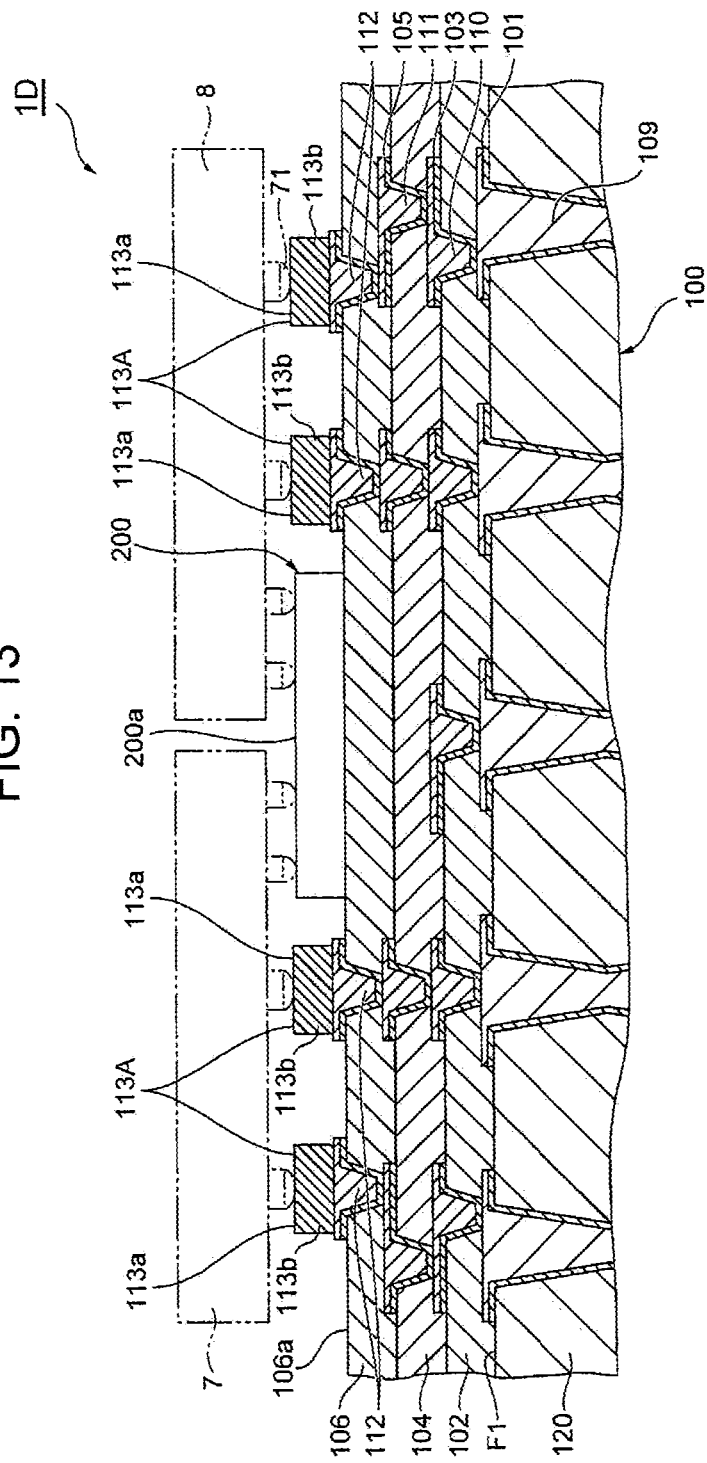
FIG. 13 is a schematic cross-sectional view of a printed wiring board according to a fourth embodiment of the present invention.
Figure 14:
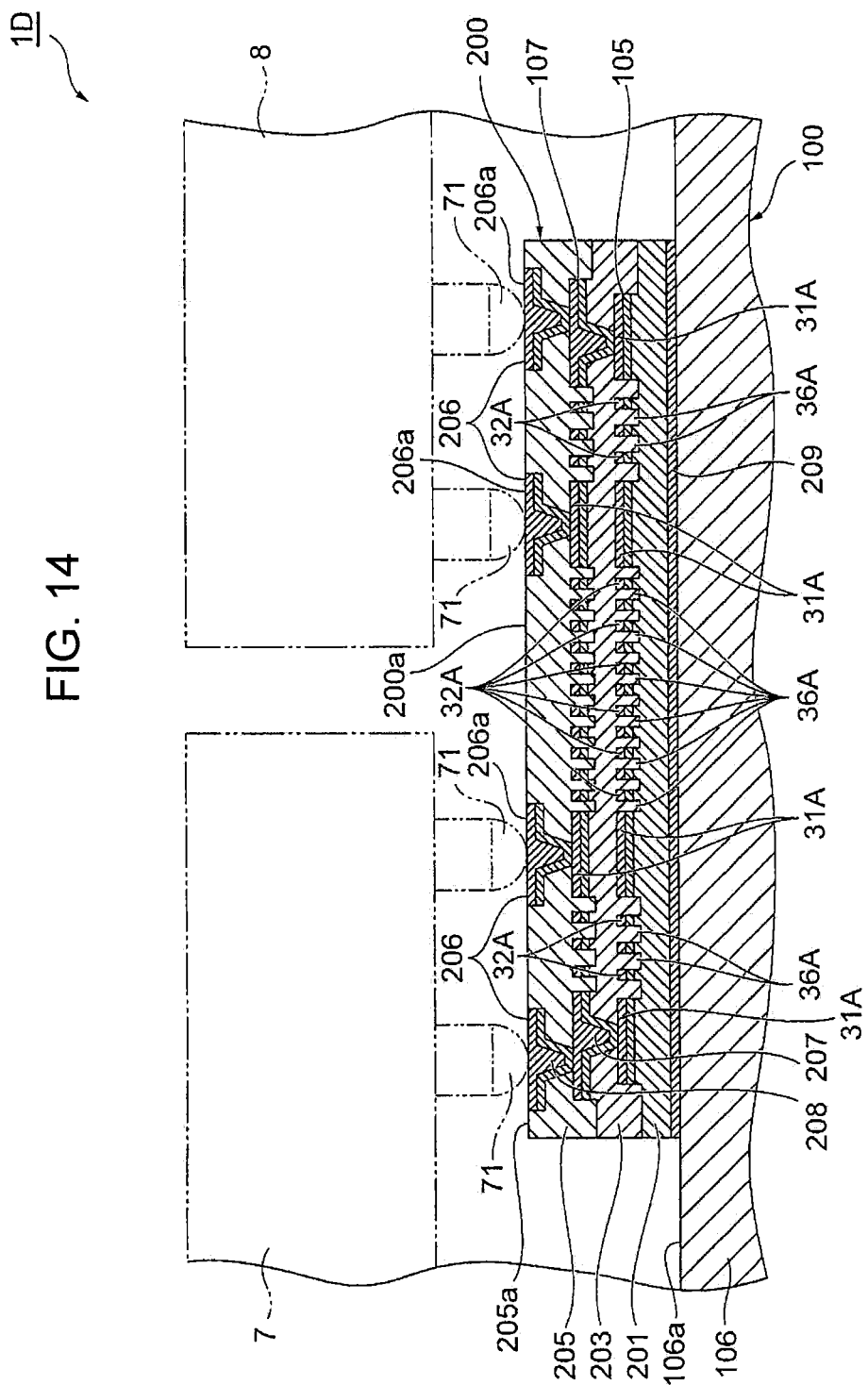
FIG. 14 is an enlarged cross-sectional view illustrating a sub wiring board of FIG. 13.

FIG. 13 is a schematic cross-sectional view of a printed wiring board according to a fourth embodiment of the present invention. FIG. 14 is an enlarged cross-sectional view illustrating a sub wiring board of FIG. 13. The printed wiring board of the fourth embodiment is mainly different from the printed wiring board of the third embodiment in that, without providing the recess 122 for positioning the sub wiring board 200 in the main wiring board 100, the sub wiring board 200 is pasted on a planar surface of the main wiring board 100, and in that conductor members (conductor posts) (113b) for adjusting positions of upper surfaces of first main conductor pads (113A) are provided. The fourth embodiment is the same as the third embodiment in that the sub conductor patterns (32A, 32A, . . . ), the recesses (36A, 36A, . . . ) and the like are formed in the sub wiring board 200.

Specifically, the sub wiring board 200 is fixed on an upper surface (106a) of the third main insulating layer 106 of the main wiring board 100 via the die attach film 209 (see FIG. 14). The sub wiring board 200 according to the present embodiment, unlike the first embodiment, is not covered by a main insulating layer, and protrudes to the outside from the third main insulating layer 106. Therefore, the third sub insulating layer 205 of the sub wiring board 200 forms an outermost layer of the printed wiring board (1D).

The sub conductor pads (206, 206, . . . ) that are formed on the third sub insulating layer 205 are exposed to the outside, and the first semiconductor element 7 and the second semiconductor element 8 are mounted via the solder bumps 71. Further, similar to the third embodiment, an outermost layer of the sub wiring board 200 is a layer that includes the sub conductor pads (outermost conductor pads) 206 that are positioned outermost, and the third sub insulating layer (outermost insulating layer) 205 that is formed of an insulating material and is positioned outermost. The upper surfaces (206a) of the sub conductor pads 206 and the upper surface (205a) of the third insulating layer 205 are formed on the same plane. That is, the upper surface (200a) (exposed surface) of the sub wiring board 200 is flat. In this way, by forming the upper surfaces of the sub conductor pads 206 and the upper surface of the third insulating layer 205 on the same plane, short circuiting due to soldering between the sub conductor pads 206 can be prevented.

Further, the conductor members (113b) are respectively formed on the first main conductor pads (113A). By providing the conductor members (113b), the upper surfaces (206a) of the sub conductor pads 206 of the sub wiring board 200 (the upper surface (200a)) and the upper surfaces (113a) of the first main conductor pads (113A) are formed on the same plane. The conductor members (conductor posts) (113b) can be formed as follows. Specifically, after the formation of the conductor layer (see the conductor pads 113 of FIG. 11) as illustrated in third embodiment, a resist is applied and openings are formed in a layer formed by the resist such that the conductor layer is exposed. The conductor members (113b) are formed in the openings using a Cu electrolytic plating (electroplating) method and thereafter the resist is removed. As a result, the mountability of the first semiconductor element 7 and the second semiconductor element 8 can be improved. In the present embodiment, the conductor pads (113A) are formed by separately providing the conductor members (113b). However, without being limited to this method, for example, it is also possible that the upper surfaces (206a) of the sub conductor pads 206 of the sub wiring board 200 (the upper surface (200a)) and the upper surfaces (113a) of the first main conductor pads (113A) are formed on the same plane by reducing the number of laminated layers of the sub wiring board 200 or by forming the first conductor pads to have thick thicknesses when electroplating is performed. Further, similar to the second embodiment, the conductor patterns (32A) and the recesses (36A) are formed in the sub wiring board. Therefore, the same ion migration reduction effect as the effect described in the second embodiment can be expected. In the present embodiment, the upper surfaces (206a) of the sub conductor pads 206 and the upper surfaces (113a) of the first main conductor pads (113A) are formed on the same plane. However, the positions of these upper surfaces may also be offset from each within a range that allows the first semiconductor element 7 and the second semiconductor element 8 to be mounted.

EXAMPLES

In the following, examples of the present invention are described.

Example 1

A test specimen was prepared using the following method. First, a silicon substrate was prepared. An insulating layer (WPR-5100 from JSR Corp.) as a lower layer was formed on a surface of the silicon substrate such that the surface became a planar surface. The insulating layer contains nano filler made of rubber which is 50-100 nm in particle diameter. Next, a TiN/Ti layer as a seed layer was formed on the surface, and a resist solution was applied to the entire surface. Thereafter, a resist layer that was formed by the resist solution was exposed and developed using an exposure device such that the resist layer has a pattern width of 1 μm and a pattern interval of 1 μm. Portions exposed from the resist layer were electroplated. Thereafter, the resist layer was removed. Further, exposed portions of the seed layer only were removed. As a result, conductor patterns having a line and space (L/S) of (1 μm)/(1 μm) were formed on the surface of the insulating layer.

Next, the surface of the insulating layer between the conductor patterns was etched using an ashing device. As a result, a recess was formed that is recessed relative to a contact interface at which the conductor patterns and the insulating layer are in contact with each other. The recess has a depth of 1.0 μm. Further, an upper-layer insulating layer made of the same resin as the lower-layer insulating layer was further formed such that a space of the recess between the conductor patterns was filled. The material that forms the insulating layers is a resin material having a water absorption rate of 1.5% by mass as measured using a measurement method in conformity with JIS K 7209.

Example 2

A test specimen was prepared in the same way as in Example 1. The present example is different from the example 1 in that an etching using the ashing device was reduced so that the recess had a depth of 0.1 μm.

Example 3

A test specimen was prepared in the same way as in Example 1. The present example is different from the example 1 in that the etching using the ashing device was increased so that the recess had a depth of 2.0 μm.

Example 4

A test specimen was prepared in the same way as in Example 1. The present example is different from the example 1 in that a resin material having a water absorption rate of 1.0% by mass was used as the resin of the insulating layer.

Example 5

A test specimen was prepared in the same way as in Example 1. The present example is different from the example 1 in that the conductor patterns had a line and space (L/S) of (1.5 μm)/(1.5 μm) and in that the etching time using the ashing device was reduced so that the recess had a depth of 0.1 μm.

Example 6

A test specimen was prepared in the same way as in Example 1. The present example is different from the example 1 in that the conductor patterns had a line and space (L/S) of (2 μm)/(2 μm) and in that the etching time using the ashing device was reduced so that the recess had a depth of 0.1 μm.

Example 7

A test specimen was prepared in the same way as in Example 1. The present example is different from the example 1 in that the conductor patterns had a line and space (L/S) of (3 μm)/(3 μm) and in that the etching time using the ashing device was reduced so that the recess had a depth of 0.1 μm.

Comparative Example 1

A test specimen was prepared in the same way as in Example 1. The present comparative example is different from the example 1 in that the ashing device was not used so that the recess was not formed.

Comparative Example 2

A test specimen was prepared in the same way as in Example 1. The present comparative example is different from the example 1 in that the conductor patterns had a line and space (L/S) of (1.5 µm)/(1.5 µm) and in that the ashing device was not used so that the recess was not formed.

Comparative Example 3

A test specimen was prepared in the same way as in Example 1. The present comparative example is different from the example 1 in that the conductor patterns had a line and space (L/S) of (4 µm)/(4 µm). However, in the case of Comparative Example 3, when the recess was formed, a portion of the conductor patterns fell down to the recess side, Reliability Test 1

With respect to the test specimens of Example 1-3 and the comparative example 1, a temperature of 130° C., a humidity of 85% RH and a voltage of 2 V between the conductor patterns were applied. After 25 hours had passed, whether or not a current flowing between the conductor patterns was $10^{-7}$ A or more (that is, a conduction place due to ion migration) was measured between the conductor patterns at 12 places. The results are illustrated in Table 1.

TABLE 1

|  | Test Time | L/S | Recess Depth | Conduction Places |
|---|---|---|---|---|
| Example 1 | 25 hours | 1 µm/1 µm | 1.0 µm | 0/12 |
| Example 2 | 25 hours | 1 µm/1 µm | 0.1 µm | 0/12 |
| Example 3 | 25 hours | 1 µm/1 µm | 2.0 µm | 0/12 |
| Comparative Example 1 | 25 hours | 1 µm/1 µm | None | 3/12 |

Reliability Test 2

With respect to the test specimens of Example 5-7 and Comparative Example 2, a temperature of 130° C., a humidity of 85% RH and a voltage of 2 V between the conductor patterns were applied. After 200 hours had passed, whether or not a current flowing between the conductor patterns was $10^{-7}$ A or more (that is, a conduction place due to ion migration) was measured between the conductor patterns at 12 places. The results are illustrated in Table 2.

TABLE 2

|  | Test Time | L/S | Recess Depth | Conduction Places |
|---|---|---|---|---|
| Example 5 | 200 hours | 1.5 µm/1.5 µm | 0.1 µm | 0/12 |
| Example 6 | 200 hours | 2.0 µm/2.0 µm | 0.1 µm | 0/12 |
| Example 7 | 200 hours | 3.0 µm/3.0 µm | 0.1 µm | 0/12 |
| Comparative Example 2 | 200 hours | 1.5 µm/1.5 µm | None | 1/12 |

Reliability Test 3

Figure 15:
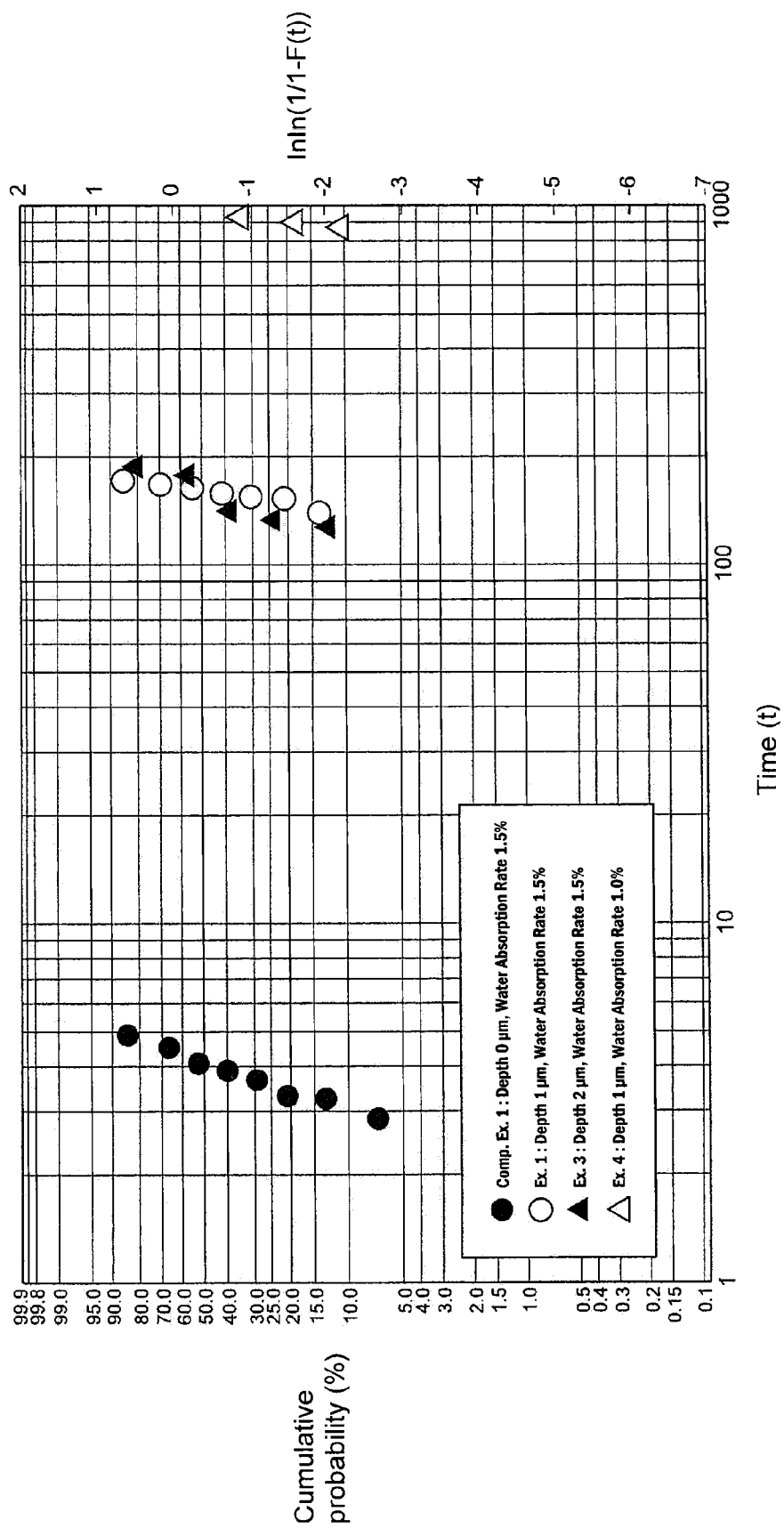
FIG. 15 illustrates results of reliability tests according to Example 1, 3 and 4, and Comparative Example 1.

With respect to the test specimens of Example 1, 3 and 4 and Comparative Example 1, a temperature of 130° C., a humidity of 85% RH and a voltage of 2 V between the conductor patterns were applied. A relation between a time (BHAST time) until a current of $10^{-7}$ A or more flows between two conductor patterns and a cumulative probability of a fault place was measured. The results are illustrated in FIG. 15.

Microscopic Observation

Cross sections of the test specimens of Example 1 and Comparative Example 1 after the reliability test 3 was performed were observed using TEM. (Results and Consideration)

As illustrated by Example 1-3 in Table 1, when the depth of the recess on the surface of the insulating layer between the conductor patterns is in a range of 0.1-2.0 µm, short circuiting between the conductor patterns can be avoided or reduced. However, as in Comparative Example 1, when the recess is not provided on the surface of the insulating layer between the conductor patterns, short circuiting between the conductor patterns occurs.

Further, as illustrated by Example 1 in Table 1 and Example 5-7 in Table 2, when the conductor patterns have a line and space (L/S) in a range of (3.0 µm)/(3.0 µm) or less, due to the recess, short circuiting between the conductor patterns can be avoided or reduced.

Further, as illustrated by Example 1 and 3 in FIG. 15, it is clear that, even when the depth of the recess exceeds 2.0 µm, further improvement in the effect due to the recess in avoiding or reducing short circuiting between the conductor patterns cannot be achieved. Further, as illustrated by Example 4 in FIG. 15, by allowing the insulating material that forms the insulating layer to have a water absorption rate of 1.0% by mass or less, further improvement in the effect of avoiding or reducing short circuiting between the conductor patterns can be expected.

Further, as a result of the microscopic observation, in the case of Comparative Example 1, copper was deposited on the surface of the insulating layer between the conductor patterns and this was the cause for the ion migration. However, in the case of Example 1, it was found that copper was not deposited on the surface of the recess of the insulating layer between the conductor patterns.

In the above, embodiments of the present invention are described in detail. However, the present invention is not limited to the above embodiments. Various design modifications can be performed within the scope without departing from the spirit of the present invention as described in appended claims.

An electronic component such as an IC chip (semiconductor element) may be mounted on a printed wiring board. Such a printed wiring board may be a substrate that is formed by alternately laminating insulating layers and conductor layers. A surface of each insulating layer of the printed wiring board is planar. On the surface of each insulating layer, as a conductor layer, conductor pads and conductor pattern (conductor wiring) are formed, the conductor pads electrically connecting an electronic component. Each of the conductor pads and conductor patterns may be a metal layer formed by plating or the like of a metal such as copper.

When the conductor patterns of the above-described printed wiring board are formed between the conductor pads that are connected to an electronic component such as a semiconductor element, they are susceptible to heat from the electronic component, and ion migration is likely to occur between adjacent conductor patterns. As a result, there is a risk that short circuiting may occur between adjacent conductor patterns (that is, between conductor wirings). Along with miniaturization and high integration of IC chips, there is a tendency that intervals between wirings become narrower and thus such a phenomenon is more likely to occur.

A printed wiring board according to an embodiment of the present invention allows ion migration to be reduced between adjacent conductor patterns that are formed between conductor pads, and another embodiment of the present invention is a method for manufacturing such a printed wiring board.

A printed wiring board according to an embodiment of the present invention includes an insulating layer that is formed of an insulating material and a conductor layer that is formed on the insulating layer. The conductor layer includes multiple conductor pads that are electrically connected to an electronic component and multiple conductor patterns that are formed between the conductor pads. The conductor patterns each have a pattern width of 3 μm or less. The conductor patterns have a pattern interval of 3 μm or less between adjacent conductor patterns. On a surface of the insulating layer between the conductor patterns, a recess that is recessed relative to a contact interface at which the conductor patterns and the insulating layer are in contact with each other is formed at least at a position along the conductor patterns. The recess has a depth in a range of 0.1-2.0 μm.

A method according to an embodiment of the present invention is provided for manufacturing a printed wiring board that includes an insulating layer that is formed of an insulating material and a conductor layer that is formed on the insulating layer. The conductor layer includes multiple conductor pads that are electrically connected to an electronic component and multiple conductor patterns that are formed between the conductor pads. The method includes: forming the conductor layer on a surface of the insulating layer such that the conductor patterns each have a pattern width of 3 μm or less and the conductor patterns have a pattern interval of 3 μm or less between adjacent conductor patterns; and etching the insulating layer such that, on a surface of the insulating layer between the conductor patterns, a recess that is recessed relative to a contact interface at which the conductor patterns and the insulating layer are in contact with each other is formed at a depth in a range of 0.1-2.0 μm at least at a position along the conductor patterns.

According to an embodiment of the present invention, the recess that is recessed at a depth in the above-described range relative to the contact interface between the conductor patterns and the insulating layer is formed on the insulating layer between the conductor patterns. As a result, a surface of the recess (the surface of the insulating layer between the conductor patterns) is offset from where an electric field having strong electric field strength is formed among electric fields formed between the conductor patterns. As a result, an electric field formed near the surface of the recess is an electric field that is weaker than the electric fields formed between the conductor patterns. Therefore, a metal that forms the conductor patterns is less likely to deposit. Further, voids are formed or an insulating material is further filled in between the conductor patterns and the recess. Therefore, the metal of the conductor patterns is less likely to move between the conductor patterns. In this way, ion migration between adjacent conductor patterns can be reduced, and short circuiting between adjacent conductor patterns can be reduced.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
    an insulating layer comprising an insulating material; and
    a conductor layer formed on a surface of the insulating layer and comprising a plurality of conductor pads and a plurality of conductor patterns such that the plurality of conductor pads is positioned to connect at least one electronic component and that the plurality of conductor patterns is formed between the conductor pads,
    wherein the plurality of conductor patterns is formed such that each of the conductor patterns has a pattern width of 3 μm or less and that the conductor patterns have a pattern interval of 3 μm or less between adjacent conductor patterns, and the insulating layer has a plurality of recess portions formed on the surface between the conductor patterns at least along the conductor patterns such that the plurality of recess portions has a depth in a range of 0.1 μm to 2.0 μm relative to a contact interface at which the conductor patterns and the insulating layer are in contact with each other.

2. A printed wiring board according to claim 1, wherein the insulating layer is formed such that the surface of the insulating layer is recessed in a depth in a range of 0.1 μm to 2.0 μm except portions forming the contact interface at which the conductor patterns and the insulating layer are in contact with each other.

3. A printed wiring board according to claim 2, wherein the plurality of recess portions is formed between the conductor patterns such that each of the recess portions has a width which is greater than the pattern interval of the conductor patterns with respect to a width direction of the conductive patterns.

4. A printed wiring board according to claim 2, wherein the insulating material of the insulating layer comprises a photosensitive resin.

5. A printed wiring board according to claim 2, wherein the insulating material of the insulating layer has a water absorption rate of 1.0% by mass or less.

6. A printed wiring board according to claim 1, wherein the plurality of recess portions is formed between the conductor patterns such that each of the recess portions has a width which is greater than the pattern interval of the conductor patterns with respect to a width direction of the conductive patterns.

7. A printed wiring board according to claim 1, wherein the insulating material of the insulating layer comprises a photosensitive resin.

8. A printed wiring board according to claim 1, wherein the insulating material of the insulating layer has a water absorption rate of 1.0% by mass or less.

9. A printed wiring board according to claim 1, wherein the insulating material of the insulating layer comprises nano-filler.

10. A printed wiring board according to claim 1, further comprising:
    an insulating material layer having a water absorption rate of 1.0% by mass or less and laminated on the conductor layer such that the insulating material layer is filling spaces between the conductor patterns.

11. A printed wiring board according to claim 1, wherein the conductor layer is an outermost conductor layer formed in a laminated structure comprising a plurality of insulating layers and a plurality of conductor layers formed on the plurality of insulating layers, respectively, and each of the conductor layers includes a plurality of conductor pads and a plurality of conductor patterns.

12. A printed wiring board according to claim 11, wherein the plurality of conductor pads and the plurality of conductor patterns have upper surfaces on a same plane.

13. A printed wiring board according to claim 1, further comprising:
    a main wiring board comprising a plurality of main conductor patterns configured to connect a plurality of electronic components,
    wherein the insulating layer and the conductor layer are formed such that a sub wiring board comprising the insulating layer and the conductor layer is formed on the main wiring board and that the pattern width and pattern interval of the conductor patterns are narrower than a pattern width and a pattern interval of the main conductor patterns, respectively, and the plurality of conductor patterns is configured to connect the plurality of electronic components on the main wiring board.

14. A printed wiring board according to claim 13, wherein the sub wiring board is embedded inside the main wiring board.

15. A printed wiring board according to claim 13, wherein the sub wiring board is mounted to the main wiring board such that the sub wiring board is exposed from the main wiring board.

16. A printed wiring board according to claim 15, wherein the sub wiring board comprises an outermost insulating layer and a plurality of outermost conductor pads formed in the outermost insulating layer such that the outermost conductor pads have surfaces exposed on a surface of the outermost insulating layer on a same plane with respect to the surface of the outermost insulating layer.

17. A printed wiring board according to claim 1, wherein the insulating material of the insulating layer comprises filler.

\* \* \* \* \*